(12) United States Patent
Ramm et al.

(10) Patent No.: US 8,496,793 B2
(45) Date of Patent: Jul. 30, 2013

(54) VACUUM TREATMENT INSTALLATION AND VACUUM TREATMENT METHOD

(75) Inventors: Jüergen Ramm, Maienfeld (CH); Beno Widrig, Bad Ragaz (CH); Stephan Kasemann, Feldkirch (AT); Marcelo Dornelles Pimenta, Sargans (CH); Orlaw Massler, Triesenberg (LI); Barbara Hanselmann, Oberschan (CH)

(73) Assignee: Oerlikon Trading AG, Trubbach, Trubbach (CH)

( * ) Notice: Subject to any disclaimer, the term of this patent is extended or adjusted under 35 U.S.C. 154(b) by 1093 days.

(21) Appl. No.: 12/110,463

(22) Filed: Apr. 28, 2008

(65) Prior Publication Data
US 2008/0292812 A1  Nov. 27, 2008

(30) Foreign Application Priority Data

May 25, 2007  (CH) ...................................... 0843/07

(51) Int. Cl.
*C23C 14/32* (2006.01)
(52) U.S. Cl.
USPC ................................ 204/298.41; 204/192.38
(58) Field of Classification Search
USPC ....................................... 204/298.41, 192.38
See application file for complete search history.

(56) References Cited

U.S. PATENT DOCUMENTS

| 4,197,175 | A | * | 4/1980 | Moll et al. ............... 204/192.38 |
| 4,620,913 | A | * | 11/1986 | Bergman ................... 204/192.1 |
| 4,673,477 | A | * | 6/1987 | Ramalingam et al. ... 204/192.38 |
| 6,391,164 | B1 |  | 5/2002 | Beilis et al. |
| 7,160,616 | B2 | * | 1/2007 | Massler et al. ............... 428/408 |
| 2003/0234176 | A1 | * | 12/2003 | Haidar ...................... 204/192.38 |
| 2007/0000772 | A1 | * | 1/2007 | Ramm et al. ............. 204/192.38 |

FOREIGN PATENT DOCUMENTS

| DE | 3614384 | 1/1987 |
| DE | 39 41 202 | 6/1990 |
| DE | 198 26 259 | 12/1998 |
| DE | 198 41 012 | 1/2000 |
| WO | WO 02/06554 | 1/2002 |

* cited by examiner

*Primary Examiner* — Keith Hendricks
*Assistant Examiner* — Jason M Berman
(74) *Attorney, Agent, or Firm* — Notaro, Michalos & Zaccaria P.C.

(57) ABSTRACT

Vacuum treatment installation or vacuum treatment method for carrying out a plasma method, wherein the treatment is carried out in a vacuum chamber, in which are disposed a device for generating an electric low voltage arc discharge (NVBE) comprised of a cathode and an anode electrically interconnectable with the cathode via an arc generator, and a workpiece carrier electrically interconnectable with a bias generator for receiving and moving workpieces, as well as at least one feed for inert and/or reactive gas. At least a portion of the surface of the anode is therein fabricated of graphite and is operated at high temperature.

48 Claims, 7 Drawing Sheets

VACUUM TREATMENT INSTALLATION AND VACUUM TREATMENT METHOD

TECHNICAL FIELD

The invention relates to a vacuum treatment installation or a vacuum treatment method for the plasma treatment of workpieces.

PRIOR ART

Plasma-enhanced methods for coating, heating and etching various workpieces, such as for example tools or components in the area of machine and motor constructions, today assume a major position among the vacuum treatment methods. The vacuum coating method is herein frequently preceded by heating and/or etching processes, employed for specific applications, such as for example precleaning, surface activation or decoating, which are also utilized by themselves alone.

In spite of the wide use of the above methods, it is even today still difficult or complicated to operate such methods if, during a method step, insulation coatings and/or poorly conducting or insulating layers are deposited on the electrode surfaces. Such coats can form, for example, through surface or resputter effects during the heating and etching process, however in particular in vacuum coating methods for the deposition of poorly conducting or insulating layers on the electrode surfaces. Examples of such poorly conducting or insulating layers are ceramic or metalloceramic layers, as will be described below in greater detail.

DLC-like layers, by which are understood in the following layers such as are listed in VDI 2840, Table 1, column 2 "amorphous carbon layers", occupy a special position. Depending on the deposition method, these can be manufactured such that they are electrically more or less conductive or even insulating.

There are several methods for depositing carbon or carbon-containing layers on tools and structural parts. The manufacturing methods are conventionally classified according to whether or not the layer-forming components are introduced via a gas into the vacuum coating system and subsequently are decomposed in the plasma (CVD) or whether or not the conversion of a layer-forming solid to the vapor phase takes place directly in the vacuum system (PVD). Among the PVD methods are especially known vaporization processes by means of electron beam, sputtering of carbon targets and cathode vaporization by means of arc vaporization. The carbon vaporized in this manner is comprised of atoms, ions or clusters of substantially elemental carbon. In contrast, as carbon sources in the CVD process typically hydrocarbonaceous gases are utilized, such as for example $C_2H_2$, $C_2H_4$ or $CH_4$. Separation of the carbon from hydrogen takes place through dissociation in the plasma or through high substrate temperature, which leads to the dissociation of the reactive gas, also referred to as precursor, on the substrate surface. Since the high substrate temperature during the deposition of diamond-like layers on temperature sensitive workpieces is most often undesirable, the aim is the efficient decomposition of the precursor in the plasma. To avoid unnecessary heating of the workpiece, it is also desirable to carry out the decomposition of the precursor as much as possible separately before the deposition process on the workpiece. Thereby on the workpiece the layer properties can be set better and without the risk of overheating, for example, via the energy introduction of the layer-forming ions by setting a certain substrate voltage, process pressure, etc.

As described inter alia in DE 195 13 614, these requirements cannot be realized through a diode discharge, since here the workpiece[-substrates] or workpieces serve as an electrode of this discharge and the dissociation conditions cannot be isolated from the conditions of the substrate voltage.

The decomposition of gaseous precursors in a diode discharge has, in summary, the following significant disadvantages. The substrates serve as an electrode of the glow discharge leading to the fact that the loading quantities and assemblage and the workpiece geometry themselves affect the discharge, the gas dissociation and therewith the layer properties. This is undesirable since in industrial coating operation different loadings and different workpiece geometries must be treated. This dependence of loading and substrate geometry furthermore makes difficult the predictability of processes, which means large additional effort and expenditures in the process development.

A further important disadvantage of diode glow discharges is their low plasma density whereby it is not possible to decompose gaseous precursors efficiently, i.e. as completely as possible. High gas flows are thereby required in order to attain economic coating rates. Through the resulting higher pressure the risk of gas phase reactions and dust formation increases.

In an improved diode discharge, such as is described in WO2006-116889, workpiece holders or devices for the passive plasma augmentation are implemented such that under the process conditions the formation of hollow cathode discharges occur leading to an additional dissociation of the precursor. However, of disadvantage is here that these hollow cathode discharges in direct workpiece proximity lead to substrate heating and especially that they must be matched to the particular pressure and substrate voltage conditions in order to ensure the reliable ignition and operation. This leads to great effort in the design of the particular workpiece holders for different workpiece forms and to restrictions in the selection of the parameters of the deposition process such that, for example, only a relatively low coating rate can be set in order not to thermally overload the workpiece.

It is for this reason that for some years now efforts have been made in order to, as discussed above, separate the plasma, which is intended to serve for the dissociation of the gaseous precursor, from the energy introduction on the workpiece.

DE 36 143 84 describes a low voltage arc discharge (NVBE) which is operated between a hot cathode in a separate cathode chamber and an anode. The gaseous precursors are activated in the low voltage arc, ionized and, separately therefrom, a DC voltage is applied to the workpiece in order to be able to set the ion energy on the workpiece. In this publication the excitation region of the supplied gas is separated from the growth region on the workpieces. The method has, however, two decisive disadvantages which have lead to the fact that it cannot be industrially utilizable in all cases, especially when the intent is the deposition of poorly conducting or insulating layers. For one, insulating layers are deposited on the workpiece resulting in the decrease of the ion bombardment from the plasma since, starting at a certain layer thickness, the DC voltage bias is no longer effective. On the other hand, one result is that the anode of the low voltage arc discharge is also coated with an insulating layer which leads to a rise of the discharge voltage and finally to instabilities of the arc and to the termination of the DC low voltage arc discharge. Although in this specification the deposition of hard carbon, thus DLC-like, layers is described, this method did not succeed in becoming widely established in the industry due to the above described difficulties.

EP 0990061 discloses generally the advantages of an electric isolation of the excitation of the reactive gas and of the setting of the substrate voltage on the workpiece. Herein a bipolar substrate voltage is utilized since highly insulating layers are to be realized.

EP 0430872 shows the manner in which a unipolar pulsed substrate voltage can be utilized in combination with a low voltage arc discharge in order to deposit insulating layers, such as oxides and nitrides, which have an even higher electrical resistance than the hard carbon layers, on a workpiece. In this method the anode of the DC low voltage arc discharge is a cooled crucible from which the metal component of the layer-forming material is vaporized precisely through a low voltage arc discharge.

Although a pulsating substrate voltage in combination with the independent plasma generated and fed by the low voltage arc is sufficient to discharge again the surfaces of insulating layers via the electron bombardment from the NVBE plasma, methods are also known which work on the workpiece with bipolar substrate voltage and variable pulses. Such a method is described, for example, by Griepentrog in *Surface & Coatings Technology* Vol. 74-75 (1995), pp. 326-332.

Analogously to DE 36 143 84, EP 0990061 describes a device and a PE-CVD method which is based on two discharges operated independently of one another, wherein, in contrast to Griepentrog, a variable substrate voltage is utilized.

It has been found in the meantime that DLC-like, in particular hard, hydrogen-free layers with high tetragonal layer fraction and especially good wear properties resulting therefrom are electrically highly insulating. To attain these properties, a low substrate temperature is inter alia also decisive. It has further been found that the use of a DC low voltage arc is a highly efficient method for decomposing the gaseous precursors. However, it has also been found that the conventionally cooled metallic anode of the low voltage arc discharge becomes coated with an insulating layer within a short time which leads to process instabilities, especially with longer coating times.

DESCRIPTION OF THE INVENTION

The invention addresses the problem of providing a vacuum treatment installation for carrying out a plasma method, wherein the treatment installation comprises at least one vacuum chamber in which a device for generating an electric low voltage arc discharge (NVBE) comprised of a cathode and an anode, electrically interconnectable with the cathode via an arc generator, and a workpiece carrier, electrically interconnectable with a bias generator, for receiving and moving workpieces, as well as at least one feed for inert and/or reactive gas are disposed or a vacuum treatment method with which it is possible to carry out plasma treatment of workpieces under different conditions, in particular also with certain reproducibility and productively, if, when operating a low voltage arc discharge with conventional installations or methods, there is the risk of the formation of an insulation coating, in particular an insulating layer on the anode surface. Through such insulation coatings, which for example during a plasma heating step in which electrons are drawn onto the workpiece, or during a plasma etching step in which positive ions are drawn out of the plasma of a low voltage arc discharge onto the workpieces as well as through insulating layers which can become deposited on electrode surfaces during a coating process, in known vacuum treatment installations or methods, process fluctuations or also process termination and damage of installation components may occur since the current flow from the plasma is conducted onto smaller areas or over other more conductive areas or is interrupted completely.

A further problem addressed by the invention is making the dependency of the plasma formation to a great extent independent of the holder geometry or of the installation of additional passive plasma-augmenting structural parts. Therewith, for example, processes for the treatment of workpieces through pulsed glow discharges can also be operated stably and flexibly. Adaptation of the holder geometry for the maintenance of dark space distances is therewith no longer necessary.

These problems are solved according to the invention through the characteristics defined in the claims. In the dependent claims and the following description corresponding further embodiments of the invention will be disclosed.

The vacuum treatment installation includes at least one vacuum chamber, in which a device for generating an electric low voltage arc discharge (NVBE) —here used synonymously with the term low voltage arc (NVB) —comprised of a cathode and an anode interconnectable with the cathode via an arc generator, is disposed wherein at least a portion of the surface of the anode is fabricated of graphite in order to permit a high operating temperature, i.e. a hot anode. Further are located in the chamber a workpiece carrier electrically interconnectable with a separate bias generator for receiving and moving workpieces as well as at least one feed for inert and/or reactive gas.

For the graphite anode several types of implementation are considered. The anode can be fabricated entirely of graphite, wherein at least in the immediate proximity of the surface no cooling devices, in particular cooling bores for coolants, are provided in order, for example, to ensure for the deposition of DLC layers a minimum operating temperature of 200° C., preferably of 250° C.

The graphite anode can alternatively comprise only a graphite covering, which is implemented as a graphite inlay or graphite overlay or as a graphite crucible. For this purpose the graphite covering can simply be disposed on a known cooled anode body, for example of copper, and consequently be cooled indirectly.

Even if for the deposition of DLC layers the temperatures attained with the above listed anodes through the particle bombardment from the NVBE to obtain at least partial graphitization of the layer, and therewith to maintain the conductivity of the anode, it can be advantageous, especially for the production of other poorly conducting or insulation layers, to heat the graphitic surface of the anode or to omit the cooling entirely. The additional heating can therein be ensured through known devices, for example through heating elements installed in the anode or graphite covering or through radiators directed onto the graphite surface.

The anode can here be disposed on or in one side of the treatment installation encompassing the workpiece carrier or preferably in the center of an at least substantially rotationally symmetric workpiece holder. For a more uniform distribution of the plasma in the vacuum chamber, several anodes can be assigned to one cathode or several cathodes to one anode. The latter is preferred if especially high plasma densities are required or, for example, for increasing the process reliability, a reserve cathode is provided.

The device for generating the low voltage arc discharge can additionally be disposed axially to one or several electromagnetic coils for generating a Helmholtz field. Therewith the distribution of the plasma in the vacuum chamber can also be influenced or the ionization can be increased. The NVBE can, for example, be focused on the anode and therewith, for example, heat the surface more strongly or the material can be vaporized out of a graphite crucible. Furthermore, known methods, such as heating or etching of the workpieces by means of NVB, can therewith be supported.

As the bias generator for applying an electric signal to the workpiece carrier and workpieces, an AC current, a bipolar pulse generator, preferably, however, for temperature sensitive workpieces or coating processes, a DC or unipolar pulse generator can be utilized, since in the case of the latter a lower thermal loading of the workpieces/layers takes place through the absent electron bombardment.

As arc generator for supplying the low voltage arc discharge (NVBE), a high current DC generator, in particular a DC generator with regulatable output current, is utilized. In addition, parallel or in series with the DC generator, a pulse generator can be connected in order to increase, for example, the plasma density further.

As the cathode of the low voltage arc discharge can be utilized a hot cathode with glow filament or heating coil, preferably in an ionization chamber separated by a shutter from the vacuum chamber, an NVB arc cathode or a hollow cathode, for example a hollow cathode with hollow cathode glow discharge or an electron gun with hollow cathode arc.

The cathode can alternatively be implemented as NVB arc cathode, which comprises at least one cathodically connected target, which is optically separated through a covering from the vacuum chamber, in particular from the workpieces.

In the described embodiments the vacuum treatment installation can be operated or implemented as a plasma CVD and/or PVD vacuum coating installation. For carrying out PE (plasma enhanced) CVD processes the installation can be utilized without further modifications. In order to ensure optimum layer distribution or to introduce different process gases, it can, however, be advantageous to dispose one or several gas sources distributed over the receptacle or to utilize annular or lance-like gas inlets.

For carrying out PVD processes, in the vacuum chamber one or several vaporizer sources can be disposed. As vaporizer sources the following devices are preferably feasible: a sputter source, in particular a magnetron, an arc source, in particular a cathodic arc source, an electron gun vaporizer or a graphite crucible. If, for example, only an adhesion layer or an additional layer element to the layer otherwise produced in the PE-CVD method is to be inserted, for example, an appropriate material can be placed into said anodic graphite crucible and be vaporized by the NVB.

In the vaporizer source generally the following material can be disposed for vaporization: carbon, a metal or an alloy, in particular an alloy of two or more elements of Group IV, V or VI of the periodic system of elements, as well as aluminum, boron or silicon, wherein, depending on the vaporizer source, the material is present in the form of a target, pellet, tablet, wire or the like.

If graphite is to be vaporized from a target of a sputter or an arc source, a dense, highly pure graphite with preferably isotropic structure is advantageously utilized in order to make the erosion of the surface as uniform as possible. For example, graphite types starting at a density of $\rho \geq 1.8$ and a purity class of P30, which corresponds to an ash value of less than 15 ppm, are suitable for such applications.

On an above described vacuum coating installation a vacuum coating method according to the invention for coating workpieces with at least one poorly conducting, insulating and/or DLC-like layer can also be carried out, wherein the surface of the anode, at least partially comprised of graphite, is so heated that at least during the coating method a deposition of insulating layers is prevented and a sufficiently conductive surface is available to ensure a stable course of the process. It becomes thereby possible to set via the substrate voltage and the process pressure the energetic conditions on the workpiece surface, and simultaneously, electrically isolated therefrom, to operate a low voltage arc discharge for the efficient decomposition and ionization of the reactive gas. It is obvious to a person of skill in the art that such a method is of advantage even if, for example, in the case of non-layer forming plasma processes, such as, for example, in etching or heating processes, through surface reactions with reactive gas or resputter effects an insulating coat on the anode surface is formed.

In PE-CVD and PVD methods the coating method is conventionally preceded by etching or heating processes. Therein is revealed that in such combined methods, in which poorly conducting, insulating or DLC-like layers are deposited, it is difficult or impossible to correctly dimension a hot metallic anode for a wide range of different low voltage arc discharge currents. Most often for the heating and/or etching process a higher discharge current is utilized than in coating and consequently the anode is thermally more highly loaded. Depending on the dimensioning or cooling, the metallic anode can therefore become too hot and vaporize during the pretreatment or it can be partially or completed coated with a poorly conducting or insulating layer during the coating phase. The anode areas in this case vary and the discharge parameters also vary correspondingly. A balance between poor cooling and secure prevention of the vaporization of portions of the anode is difficult to set and reproduce for metallic anodes. In contrast, surprisingly simple for such methods has been found the use of a graphite anode according to the invention, which is implemented to be either not cooled or correspondingly larger and therewith more poorly cooled. Since even at high temperatures graphite has a very low vapor pressure, there is no risk of contamination of the layers to be produced.

Depending on the type of coating, maintenance of the conductivity through the high surface temperatures can herein be traced back to different processes. For example, for temperature sensitive layers, which decompose to a conducting layer coating on the hot anode surface, it is often not necessary that the graphite anode glows. In the deposition of DLC, for example, in particular ta-C layers, the deposition of an insulating coat on surfaces of the anode can already be securely avoided depending on the process (PE-CVD, sputtering, cathodic arcing) or the reactive gas starting at temperatures from 200° C. up to at most 300° C., since apparently under these conditions graphitization of the layer occurs. Additional bombardment of the anode with high electron or ion densities appears here also to advance the opening of, for example, $sp^2$ and $sp^3$ bonds. With this simple solution was shown that for the first time a DC low voltage arc discharge could be stably operated for insulating layers.

Even after coating processes in which, after reaching ambient temperature, an insulating layer was measured on the graphite anode, this [anode] could unexpectedly be used again without cumbersome mechanical removal of the layer if this [anode] before ignition of the low voltage arc had been brought to the temperature through an additional, as described above, heating appliance. In this case, however, a higher surface temperature on the anode had to be set. In the range of incipient red heat, thus between 600 to 700° C., the NVB could, however, even after production of highly insulating layers, such as for example AlN or SiN, be reliably ignited, while 400° C. represents for most layers a lower limit.

Depending on the process management, coating material can be supplied individually, alternatingly or simultaneously from at least one gas source and at least one vaporizer source.

From the gas source reactive gases, such as nitrogen, hydrocarbons, silanes, boranes, germanes, nitrogen or metallo-organic compounds can be supplied in known manner for the layer production as well as inert gases which can be effectively decomposed and ionized through the plasma of the low voltage arc discharge. The like applies to the capability of ionizing or re-ionizing coating material supplied from an above described vaporizer source if ionized particles already leave the vaporizer source.

During the pretreatment and/or during the coating process the electrical supplies of substrate voltage, low voltage arc, the sputter and/or arc source can each, as described, be operated with DC current or pulsed. An additional guidance of the low voltage arc discharge through a magnetic field, or a Helmholtz magnetic field, has been found to be advantageous in operating a low voltage arc discharge in the axis of symmetry of the coating installation.

If coatings with different layer stress, for example as multilayers, are to be deposited, this can take place through variation of the arc power, of the substrate voltage and/or of the magnetic field. DLC multilayers with layer stress differing from coating layer to coating layer were, for example, set through periodic or aperiodic change of the substrate voltage or of the arc current. Both measures lead to a change of the ion bombardment and therewith affect the fault sites and residual stress of the layer.

If the layer is to be deposited only from the triode plasma without additional vaporizer sources, this can take place by supplying at least one reactive gas from the group of hydrocarbons, silanes, germanes, boranes and/or the metallo-organic compounds.

When operating a sputter source and/or a cathodic arc source with a target of metal, a metal alloy, a metal compound, such as for example carbides or borides, or of graphite, the layer formation can take place under inert gas. However, in many cases here an additional or, in the case of an arc process, even exclusive supply of reactive gas for the layer formation is also feasible or advantageous.

With such methods mono or multilayer coatings, which comprise at least one layer of one of the following materials, can be deposited: a carbide, a carbonitride, a nitride, a boride, a boron carbide, a boron nitride, and their compounds with preferably at least one transition metal from Group IV, V, or VI of the periodic system of elements and/or aluminum or silicon. Examples of such layers are ceramic or metalloceramic layers such as SiN, AlN, $Ge_3N_4$, (AlCrSi)N, (AlCrMe{=metal})N, (AlCrSiMe)N, (TiSi)N, hBN, cBN, BCN, TiBC and others. These layers can further also contain oxygen, such as for example (AlCrSi)CNO, (AlCrSi)NO, unless the process is conducted under too high a partial pressure of oxygen, which could lead to damage of the graphite surface of the anode.

The transitions between the individual coating layers can therein be implemented in principle in any desired manner, however, in many cases for known reasons a fluid transition will be preferred through stepwise or continuous variation of the process parameters, such as for example gas flow, partial pressure of the reactive gas, vaporizer source power, arc power or substrate voltage, etc.

Applying an above described substrate voltage, DLC layers can also be produced by merely supplying at least one reactive gas, in this case a hydrocarbon, into the plasma of the NVBE. If especially hard or low-hydrogen DLC layers, for example ta-C layers are to be produced, a method using a sputter and/or a cathode arc source, each with a graphite target, is advantageous. Here also, as shown below, by supplying at least one hydrocarbon the layer hardness can unexpectedly be increased compared to the operation in a pure inert gas plasma.

To improve the adhesive strength or for decreasing layer stresses that are too high, the DLC layer can be deposited as a multilayer coating with a metal or silicon-containing adhesive layer or with at least one metal or silicon-containing intermediate layer.

If different layer properties, such as for example excellent adhesive strength and sturdiness of metal-containing layers, are to be combined with the especially good slide properties or hardness of DLC layers, first, as described above, for example one layer comprised of a carbide, a carbonitride, a nitride, a boride, a boron carbide or a boron nitride can be applied on a workpiece and this [layer] can subsequently be coated over with an above described DLC layer.

BRIEF DESCRIPTION OF THE DRAWING

In the following the invention will be described in greater detail in conjunction with Figures which only represent different embodiment examples. In the drawing depict:

FIG. 1 shows a vacuum coating installation with an anode according to prior art. In the vacuum chamber 1 the workpieces 2 to be coated are mounted on one or several workpiece receivers 3 comprising means for generating an at least simple, if needed also double 4 or triple 5, rotation of the parts. The workpiece receivers 3 are frequently positioned on a workpiece carrier 7 rotatable about the installation axis 6.

Figure 1:
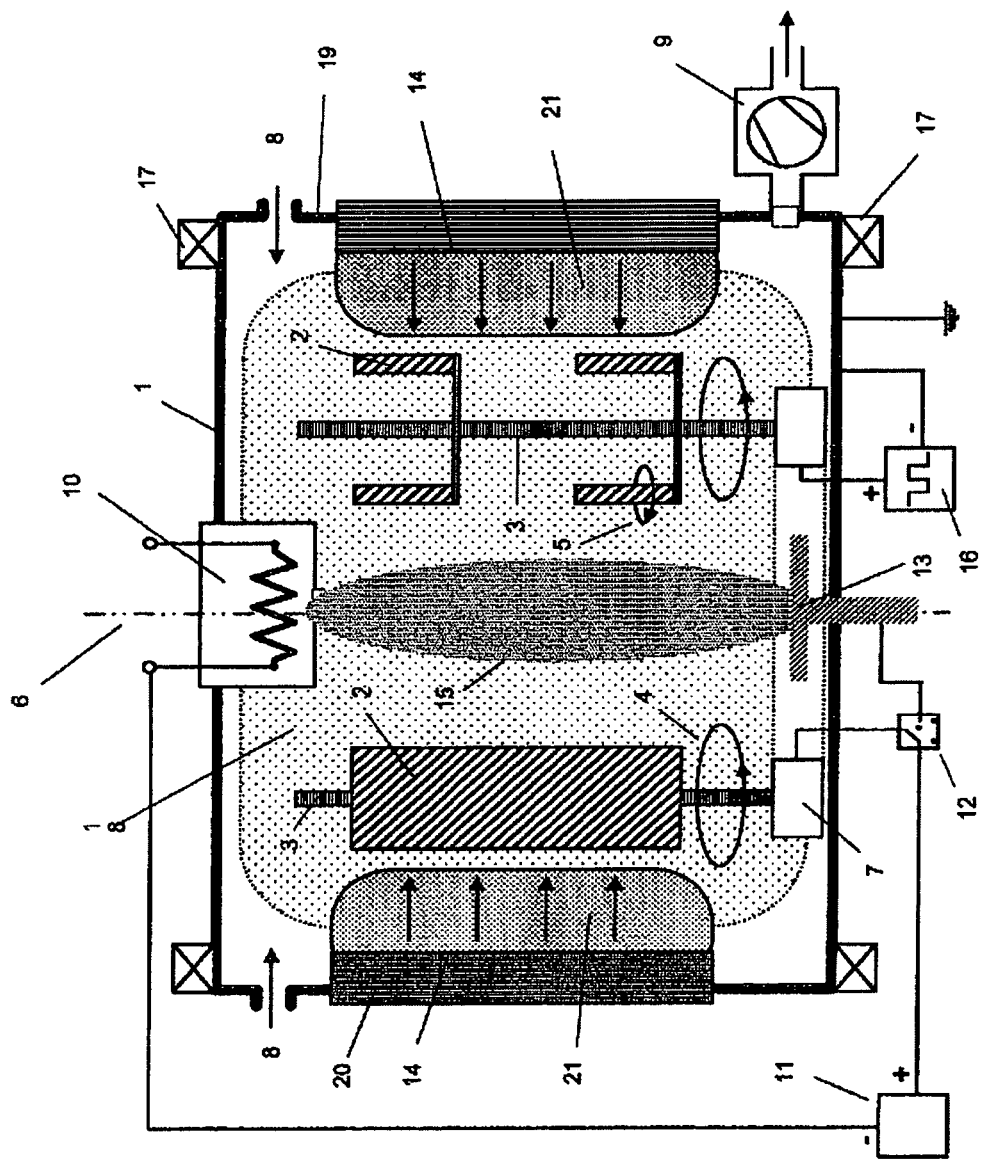
FIG. 1 a vacuum coating installation with anode according to prior art.

Via gas feeds 8 the different process gases can be supplied by means of suitable, not shown here, regulation devices.

A high-vacuum capable pump stand 9 is flanged onto the chamber.

An ion and/or electron source, in particular an NBE cathode 10, is disposed, for example, in the proximity of the installation axis and connected to the negative output of an arc generator 11. Depending on the process step, the positive pole of the arc generator 11 can be applied via a switch 12 to the workpiece carrier 7 or to the workpiece receiver 3 and the workpieces 2 (heating process) electrically connected thereto or to the NVB anode 13 (in etching process or if needed also during the coating process).

On the walls of the vacuum chamber 1 one or several vaporizer sources 14, preferably a magnetron or a light arc vaporizer, can be provided. In another embodiment, not shown here, of the vaporizer source 14 this source can be disposed as an anodically connected crucible centrally in the bottom of the vacuum chamber 1. The vaporizer material can be converted to the gaseous phase by means of heating through the low voltage arc 15.

Further is provided an additional electric bias generator 16, with the aid of which a substrate voltage can be applied to the workpieces.

Further can be disposed electromagnetic coils 17 for the generation of a longitudinal magnetic field penetrating through the plasma volume, of a so-called Helmholtz field, on opposite delimitation walls of the vacuum chamber 1 and be fed through at least one, preferably two separate, DC voltage sources, not shown here, preferably in the same direction.

As additional measures for the augmentation or more uniform rendering of the magnetic field and, for example, of an IF plasma 18 generated through an IF bias generator on the side walls 19 of vacuum chamber 1, magnet systems for developing several magnetic near fields 21 can be located. In this case the magnet systems for the near field generation are preferably at least partially implemented as magnetron magnet systems 20.

The individual systems of the coating installation are advantageously brought into relationship with one another through a process control not further depicted here.

Figure 2:
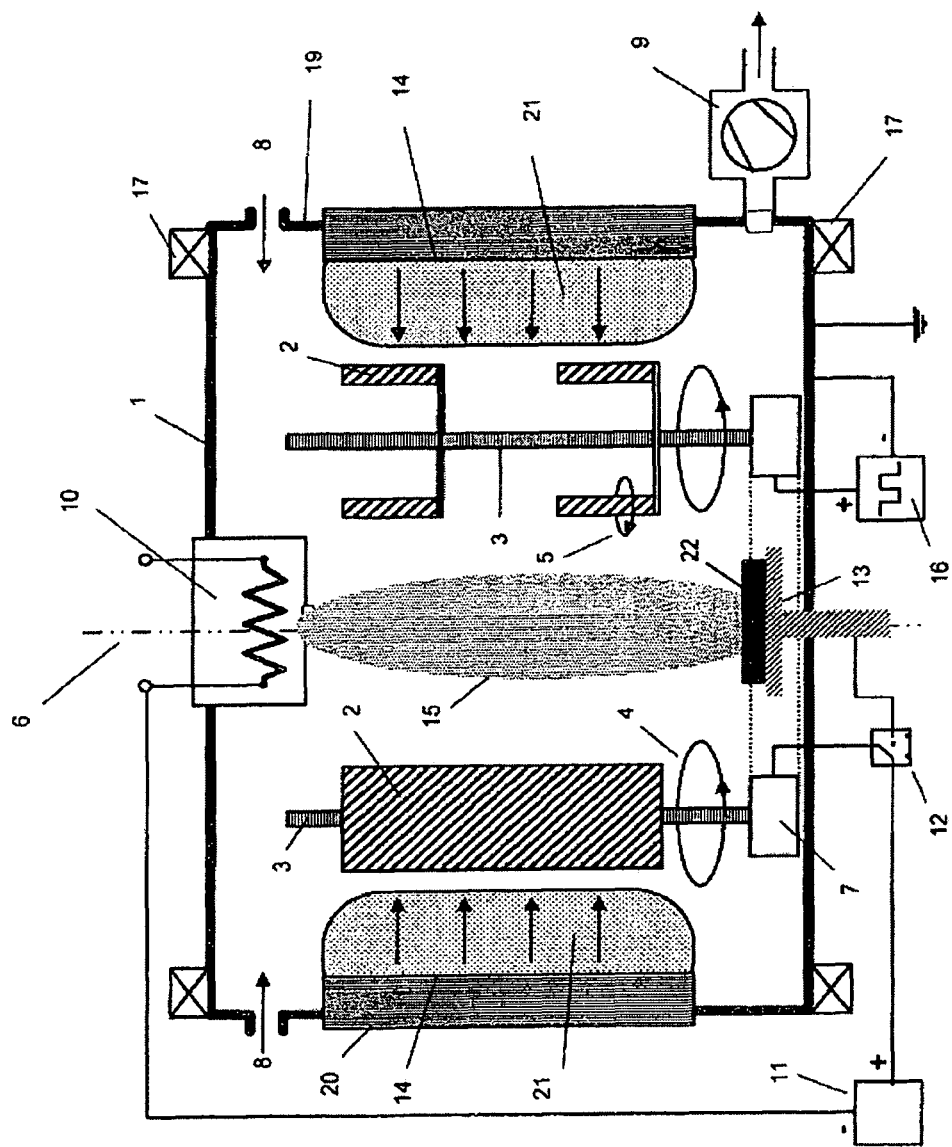
FIG. 2 a corresponding anode with graphite overlay.

FIG. 2 shows a vacuum coating installation according to the invention with a simple graphite anode, in which onto a known flat copper anode a graphite covering 22 in the form of a graphite disk is placed.

Since the plasma densities in the low voltage arc 15 and in its immediate vicinity are very high, it is, however, also necessary to protect the workpieces 2 against electric flash-overs. This can be done by selecting a suitable substrate voltage. For this reason it is also not recommended to work at high discharge currents with a bipolar substrate voltage, especially if high substrate voltages are to be realized. The reason is that at bipolar bias pulse operation during the positive voltage intervals very high electron currents can be drawn onto the workpiece. At least with DLC and ta-C, this leads to undesirable heating of the workpiece, however also to increased flash-overs onto the workpiece. Much more preventive is the use of a unipolar pulsed substrate voltage which allows the electrons from the low voltage arc in the [pulse] intervals to discharge again the surface charge built up by the positive ions. In the pulse intervals the workpiece can be operated at ground or also floating, the latter being even more preventive. However, it should be possible to form freely the pulse-interval ratio and it should be variable during the process, as should be the substrate voltage.

It is in this context important that the energy introduction on workpiece 2 can also be changed by changing the discharge parameters of the low voltage arc 15, thus, for example, for constant substrate voltage the substrate current, and therewith the substrate power, can be changed thereby that the discharge current is increased or decreased. This method can also, as stated above, be utilized for multilayer structures in a layer material of identical chemical composition in order, for example, to dissipate the stress in thick layers and to attain good layer adhesion.

The low voltage arc 15 can therein be formed in two different ways: as shown in the Figures as a linear source if the outer coils 17 are utilized for focusing, or as a diffuse plasma which is distributed over the entire process chamber such that the workpieces 2 are immersed in the plasma.

Figure 3:
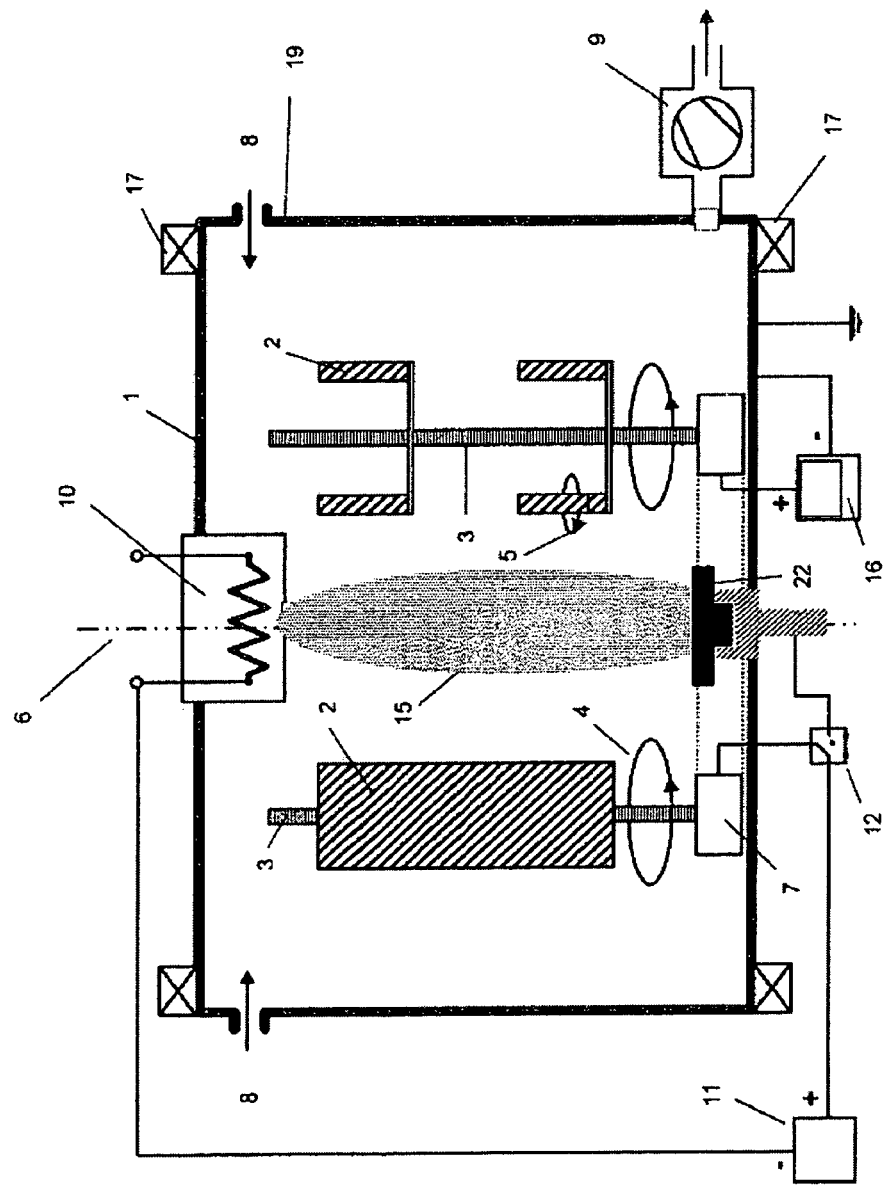
FIG. 3 a corresponding anode with graphite inlay.

FIG. 3 depicts a vacuum treatment installation according to the invention which, however, can also be operated as a vacuum treatment installation for PE-CVD processes. The graphite anode in this embodiment is implemented as a graphite inlay 22 which is emplaced in a known cooled copper crucible. The latter, in turn, can itself be implemented as a graphite crucible in order, for example, to be able to apply in simple manner an adhesive layer by introducing metal tablets or the like before the coating with a layer produced by means of PE-CVD. Furthermore, in FIG. 3 is utilized a DC bias generator 16.

Figure 4:
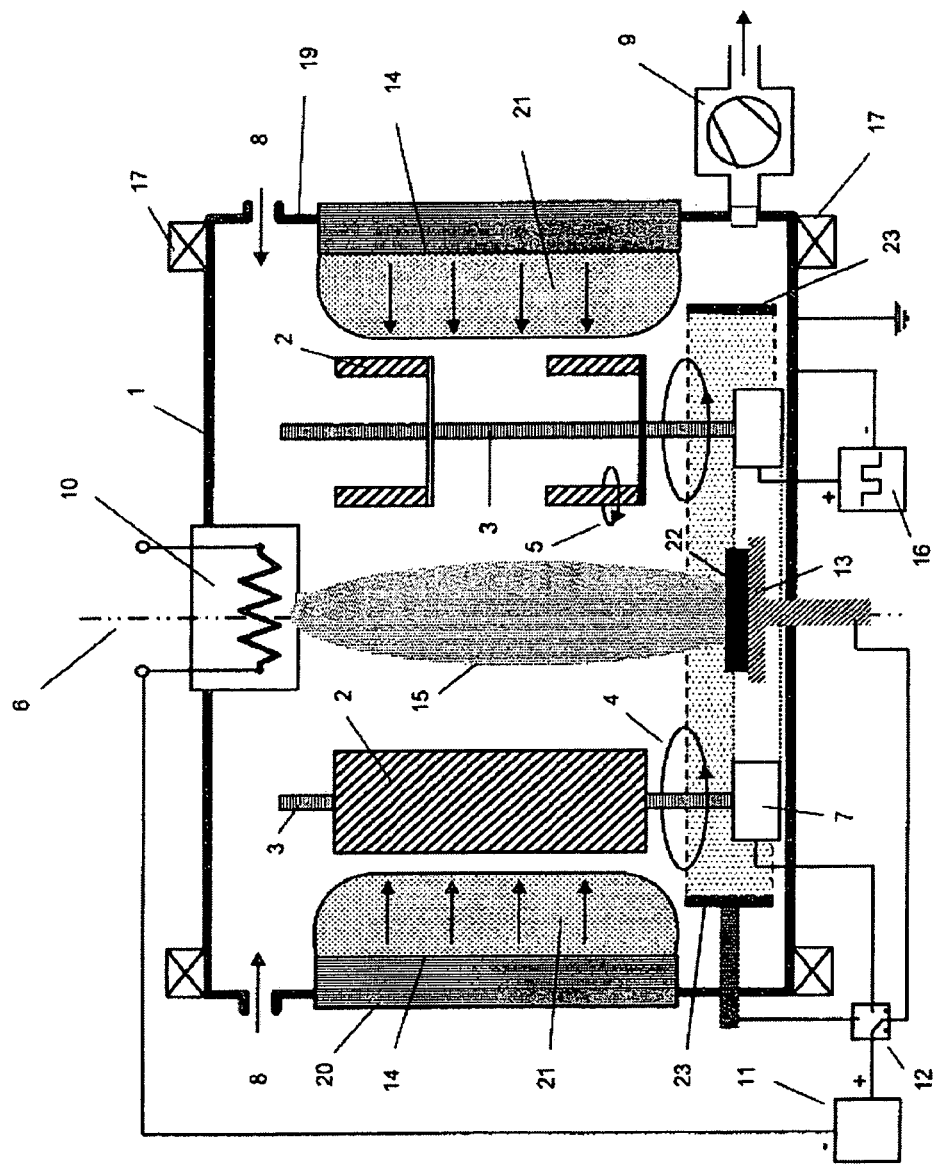
FIG. 4 a vacuum coating installation with two graphite anodes.

FIG. 4 depicts a vacuum coating installation according to the invention with graphite anode 13, in which two NBE anodes 13 and 23 are disposed. For example, via switch 12 the positive output of the arc generator can be connected alternately or simultaneously to the NVB graphite anode 13, 22 or the, in this case, annular NVB graphite anode 22. Similar to the operation without magnet coils, through the connection of the NVB ring anode 23 it becomes possible to distribute the plasma diffusely over the installation chamber 1. It is obvious to the person of skill in the art that these two options for optimization a uniform NVB plasma distribution can be optimized.

Figure 5:
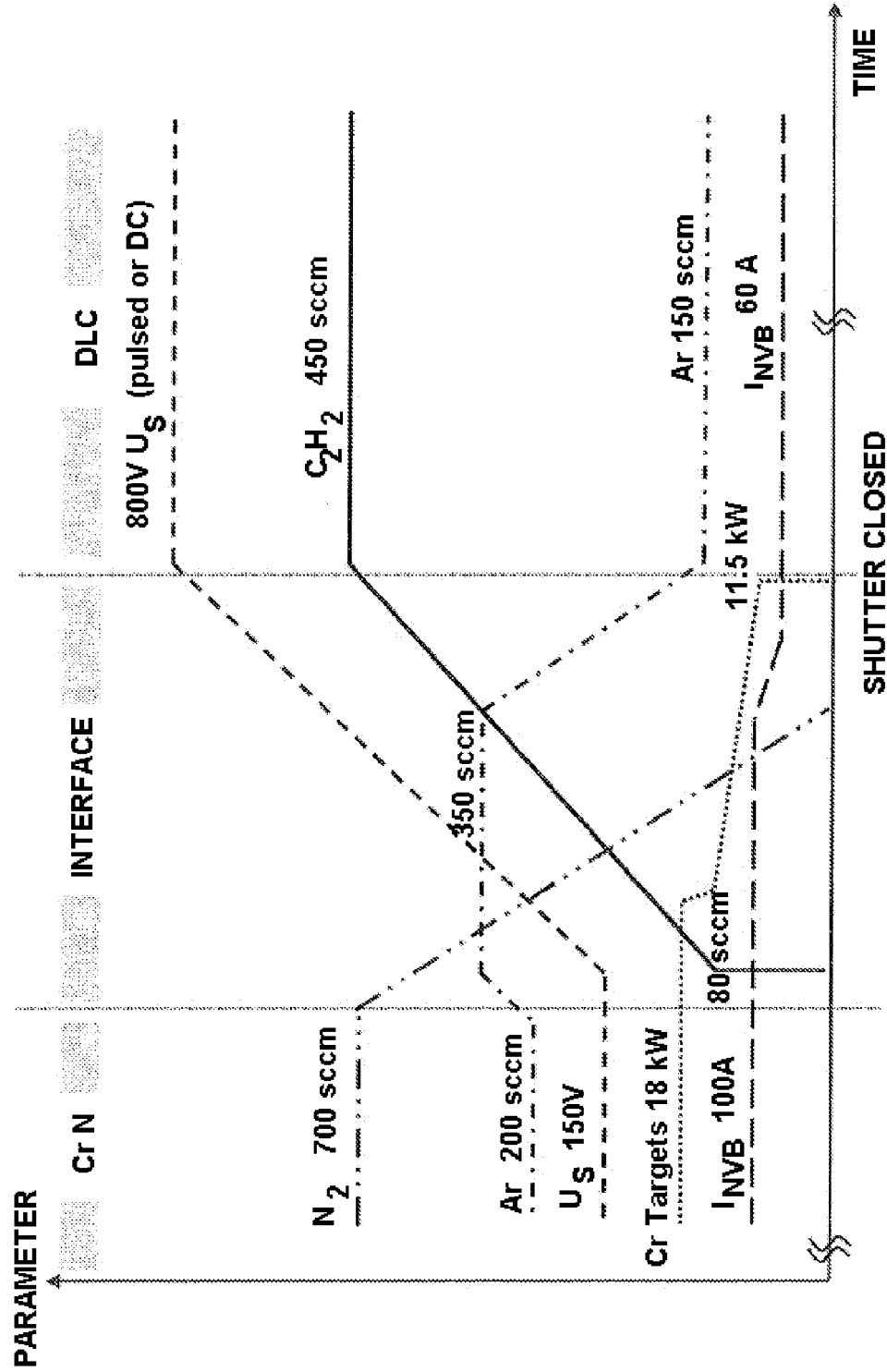
FIG. 5 a process diagram.

FIG. 5 describes by example the tracing of the process parameters in the production of a combined CrN-DLC layer with interspaced interface, within which the properties of the two different layer systems are substantially continuously adapted to one another. First, in a PVD method, for example through a sputter or arc process, a CrN layer is herein generated, subsequently during the production of the interface layer additionally a PE-CVD process is run up and simultaneously target power and nitrogen supply decreased to zero. In the last process step, which can also be applied without preceding interlayer or interface directly onto the surface of a workpiece, here constant process parameters are utilized for the production of a DLC layer isomorphous over the layer thickness.

Figure 6:
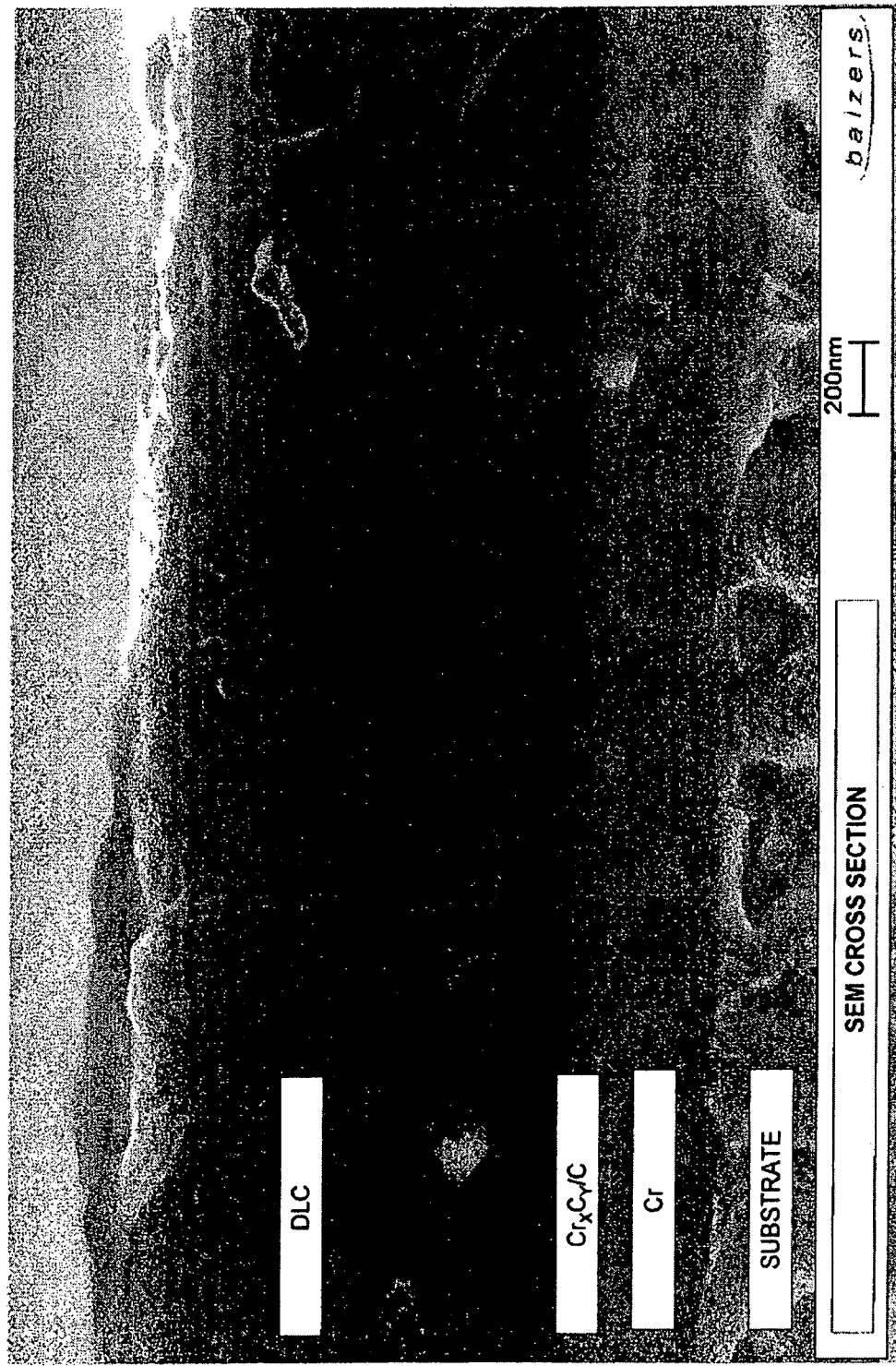
FIG. 6 a DLC layer with Cr/CrC—gradient layer.

FIG. 6 depicts an SEM micrograph of the fracture surface of a multilayered coating produced similarly to that in FIG. 5, with a chromium adhesive layer, graded interface layer and DLC cover layer.

Figure 7:
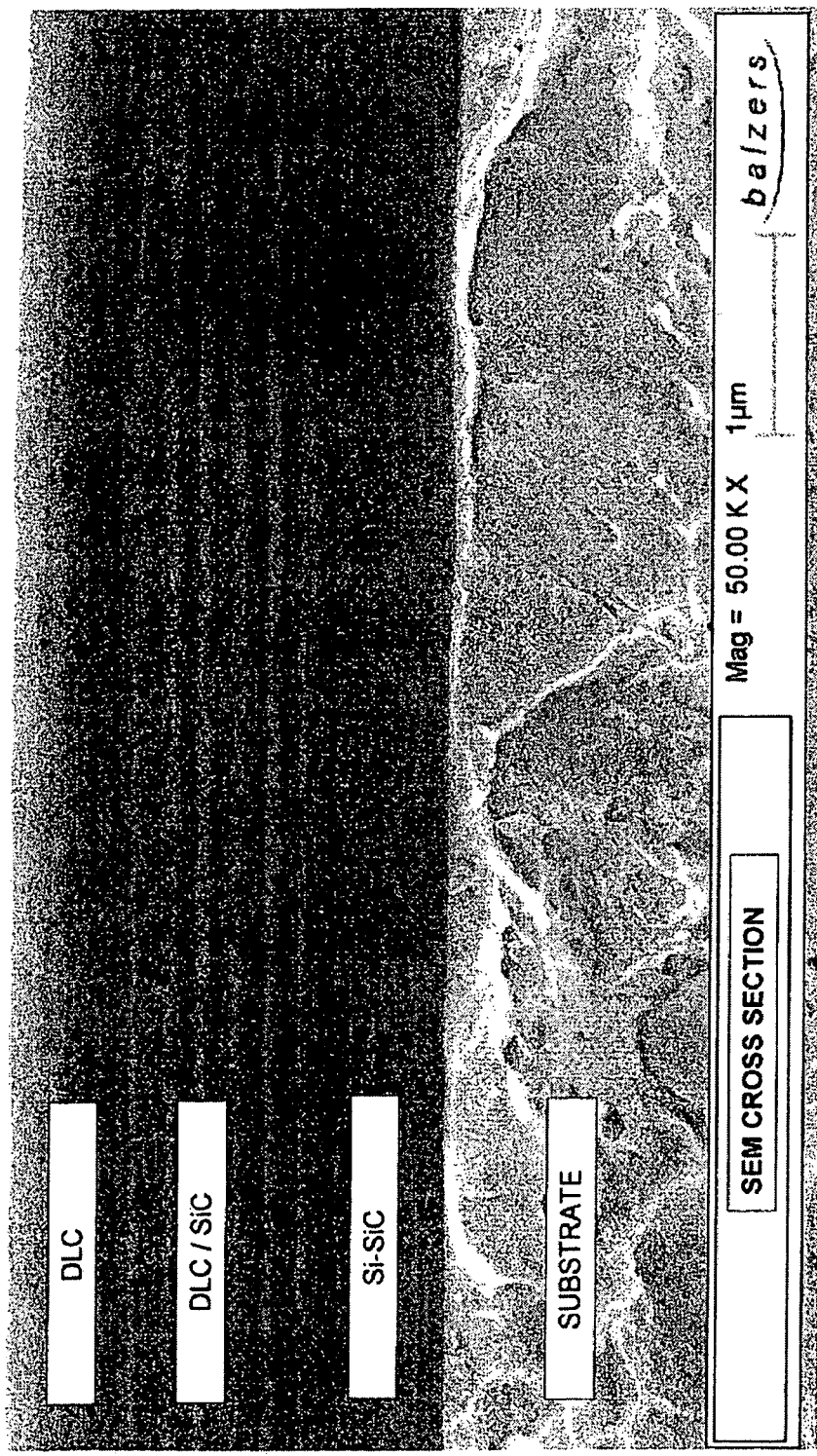
FIG. 7 a DLC layer with DLC/SiC—multilayered coating.

FIG. 7 depicts a multilayered coating deposited according to method example 2 of a sequence of different SiC and DLC layers.

Means for Embodying the Invention

In the following several examples are described of the sequence of methods according to the invention.

Examples 1 to 3, in which methods for the deposition of Si-containing DLC layers are described, were carried out on a modified RCS installation by OC Oerlikon Balzers AG, wherein onto a cooled copper anode a graphite covering in the form of a disk was placed. Therewith, in extremely simple manner a sufficient electric transition could already be produced. Simultaneously, the cooling of the graphite surface was markedly reduced compared to the original copper anode, wherewith the conductivity of the surface is even retained during the coating process.

Example 1

Process for the Production of DLC with an Intermediate Layer of Si/SiC

After inserting the workpiece into the holder provided for this purpose and doubly or triply rotatable, and introducing the holders into the vacuum treatment installation, the treatment chamber is pumped down to a pressure of approximately $10^{-4}$ mbar.

For setting the process temperature a low voltage arc (NVB) plasma is ignited between a cathode chamber, separated by an apertured shutter, with hot cathode forming the NVB cathode, and the anodically connected workpieces in an argon hydrogen atmosphere. The substrate voltage applied to the workpieces is therein preferably additionally unipolarly or bipolarly pulsed. The standard radiation heaters were not employed in this example.

The heating process is based on the following parameters:

| | |
|---|---|
| Discharge current of NVB: | 50 A |
| Argon flow: | 60 sccm |
| Hydrogen flow: | 300 sccm |
| Process time: | 20 minutes |

As the next process step etching is started. For this purpose the low voltage arc is operated between the filament and the graphite anode. In principle, a DC, a pulsed DC or an AC operated IF or RF supply can here be interconnected between workpieces and ground. For the present method a two-stage etching process with the following etching parameters was set:

Step 1:

| | |
|---|---|
| Argon flow | 65 sccm |
| Hydrogen flow: | 80 sccm |
| Discharge current of NVB: | 100 A |
| Substrate voltage: | −50 V unipolar (100 µs on/10 µs off) |
| Process time: | 15 minutes |

Step 2:

| | |
|---|---|
| Argon flow: | 65 sccm |
| Hydrogen flow: | 80 sccm |
| Discharge current of NVB: | 100 A |
| Substrate voltage: | −200 V unipolar (100 µs on/10 µs off) |
| Process time: | 30 minutes |

In the next process step the coating of the workpiece with a DLC layer and an Si—SiC interlayer was carried out for adhesion mediation and adaptation of the layer properties to the substrate material. For the coating the low voltage arc is operated. The discharge current of the low voltage arc is therein drawn toward the graphite anode. The parameters of the low voltage arc discharge which runs during the entire coating process are:

| | |
|---|---|
| Discharge current of NVB: | 40 A |
| Argon flow: | 60 sccm |

For the individual steps of the coating process additionally the following parameters were set:
Si adhesion layer:

| | |
|---|---|
| Silane flow: | 30 sccm |
| Substrate voltage: | −600 V unipolar (10 µs on/10 µs off) |
| Length of time: | 3 minutes |

SiC transition layer:

| | |
|---|---|
| Silane flow: | linear ramp from 30 sccm to 10 sccm |
| C$_2$H$_2$ flow: | linear ramp from 15 sccm to 120 sccm |
| Substrate voltage: | −600 V unipolar (10 µs on/10 µs off) |
| Length of time: | 30 minutes |

DLC function layer:

| | |
|---|---|
| C$_2$H$_2$ flow: | 120 sccm |
| Process pressure: | 0.36 Pa |
| Substrate voltage: | −600 V unipolar (10 µs on/10 µs off) |
| Length of time: | 30 minutes |

In this way a layer of approximately 1.5 µm was deposited. The temperature of the workpiece reached approximately 290° C.

Example 2

In this process the heating step was omitted and instead an extended etching step was utilized. Analogously to the preceding example, the low voltage arc is again operated between the filament and the graphite anode, and the workpieces are impressed with a unipolarly pulsed negative substrate voltage. The following etching parameters were set:

Step 1:

| | |
|---|---|
| Argon flow: | 65 sccm |
| Hydrogen flow: | 80 sccm |
| Discharge current of NVB: | 50 A |
| Bias: | −50 V unipolar (100 µs on/10 µs off) |
| Process time: | 25 minutes |

Step 2:

| | |
|---|---|
| Argon flow: | 65 sccm |
| Hydrogen flow: | 80 sccm |
| Discharge current of NVB: | 100 A |
| Bias: | −150 V unipolar (100 µs on/10 µs off) |
| Process time: | 60 minutes |

In the next process step the coating of the workpiece is carried out with a DLC—SiC multilayered coating and an Si—SiN—SiC interlayer. For the coating the discharge current of the low voltage arc is drawn toward the graphite anode. The parameters of the low voltage arc discharge are set as in Example 1.

For the individual steps of the coating process additionally the following parameters were set:
Si adhesion layer:

| | |
|---|---|
| Silane flow: | 30 sccm |
| Substrate voltage: | −600 V unipolar (10 µs on/10 µs off) |
| Length of time: | 3 minutes |

SiN transition layer:

| | |
|---|---|
| Silane flow: | 30 sccm |
| N$_2$ flow: | linear ramp from 15 sccm to 120 sccm |
| Substrate voltage: | −600 V unipolar (10 µs on/10 µs off) |
| Length of time: | 15 minutes |

SiC transition layer:

| | |
|---|---|
| Silane flow: | linear ramp from 30 sccm to 10 sccm |
| N$_2$ flow: | linear ramp from 120 sccm to 0 sccm (inert 5 minutes) |
| C$_2$H$_2$ flow: | linear ramp from 15 sccm to 120 sccm |
| Substrate voltage: | −600 V unipolar (10 µs on/10 µs off) |
| Length of time: | 15 minutes |

DLC—SiC multilayer function layer:

| | |
|---|---|
| C$_2$H$_2$ flow: | 120 sccm (for 5 minutes each time) |
| Silane flow: | 30 sccm (with C$_2$H$_2$ as above for 5 minutes each time) |
| Process pressure: | 0.3 Pa (C$_2$H$_2$) or 0.47 Pa (C$_2$H$_2$ + SiH$_4$) |
| Substrate voltage: | −600 V unipolar (10 µs on/10 µs off) |
| Length of time: | 60 minutes |

In this way a total layer thickness on workpieces with twofold rotation of approximately 1.5 µm was attained. The temperature of the workpiece reached approximately 180° C.

Example 3

In this process, as in Example 2, the heating step was omitted and instead an extended etching step was employed.

In the next process step the coating of the workpiece was carried out with an Si—SiC interlayer, followed by a DLC—Si multilayered coating and a terminating DLC layer. For the coating the low voltage arc is operated as described in Example 1.

For the individual steps of the coating process the following parameters were additionally set:

Si adhesion layer:

| | |
|---|---|
| Silane flow: | 30 sccm |
| Substrate voltage: | −600 V unipolar (10 µs on/10 µs off) |
| Length of time: | 3 minutes |

SiC transition layer:

| | |
|---|---|
| Silane flow: | linear ramp from 30 sccm to 10 sccm |
| C$_2$H$_2$ flow: | linear ramp from 15 sccm to 120 sccm |
| Substrate voltage: | −600 V unipolar (10 µs on/10 µs off) |
| Length of time: | 30 minutes |

DLC—SiC multilayer function layer:

| | |
|---|---|
| C$_2$H$_2$ flow: | 120 sccm (for 5 minutes each time) |
| Silane flow: | 30 sccm (with C$_2$H$_2$ as above for 5 minutes each time) |
| Process pressure: | 0.3 Pa (C$_2$H$_2$) or 0.43 Pa (C$_2$H$_2$ + SiH$_4$) |
| Substrate voltage: | −600 V unipolar (10 µs on/10 µs off) |
| Length of time: | 60 minutes |

For the DLC layer:

| | |
|---|---|
| C$_2$H$_2$ flow: | 120 sccm |
| Substrate voltage: | −800 V unipolar (10 µs on/10 µs off) |
| Process pressure: | 0.3 Pa |
| Length of time: | 30 minutes |

In this way a total layer thickness on workpieces with twofold rotation of approximately 2 µm was attained (see FIG. 7). The temperature of the workpiece reached approximately 180° C.

Examples 4 to 8, in which methods for the deposition of DLC layers are described, were carried out on a modified BAI830DLC installation by OC Oerlikon Balzers AG. In Examples 5 to 6 also only a graphite covering in the form of a disk was placed onto a cooled copper anode. The workpieces were doubly rotated and guided at a distance of 60-175 mm from the target, at a loading height of 10-1000 mm. Detailed specification regarding the particular process parameters as well as the layer properties attained therewith can be found in Table 1.

Example 4

This example involves a known process for purposes of comparison. Herein, after a heating or etching pretreatment at a process pressure between $5.0 \times 10^{-3}$–$2.0 \times 10^{-2}$ mbar, a glow discharge was ignited and operated between workpiece receivers and vessel wall, as already described in EP 01362931 or WO2006-116889 A1. The workpiece receivers are laid out such that in the interior burns a hollow cathode discharge augmenting the glow discharge plasma. Alternatively, other electrically conducting hollow bodies can also be employed for plasma augmentation, provided specific geometric conditions, disclosed in WO2006-116889 A1, are maintained.

Example 5) and Example 7

In these examples according to the invention a low voltage arc discharge is ignited on a graphite anode analogous to FIG. 2, disposed in the center of a workpiece holder, and maintained during the entire process sequence of heating, etching and coating. For the DLC coating two or six sputter sources equipped with graphite targets are connected up, while on the workpiece a DC bias of one hundred volts is applied. No hydrocarbon gas was introduced. Through the lower voltage also no hollow discharge is ignited in a holder or a correspondingly built hollow body. The plasma discharge is therein to a far lesser extent dependent on the geometry of the installed equipment, in particular of the workpiece carrier and the workpiece receivers.

Example 6) and Example 8

In these examples also according to the invention the process is conducted similarly to Examples 5 and 7 with two or six sputter targets, wherein, however, in addition, also a small quantity of a hydrocarbon gas is supplied. Remarkable is that, compared to purely sputtered layers, it is therewith possible to increase the layer hardness by a factor of three to four and therewith also the wear resistance by multiples.

In spite of the low hardness of the layers deposited without hydrocarbon gas of Examples 5 and 7, these layers can be applied advantageously, for example, in order to improve the running-in properties and/or slide properties of a hard layer. Such a layer system can be realized especially simply for example through a combination of the layers from Examples 6 or 8 with layers according to Examples 5 or 7 deposited thereon.

Another feasibility is operating in the above listed sputter processes, instead of DC sputtering, an AC or a pulsed sputter source, for example also as a twin source, in which two sputter targets are connected with the counterpole outputs of a bipolar pulse generator. Further, one or several sources connected with an appropriately laid out sputter generator can also be operated in the method referred to as HIPIMS (High Ionization Pulse Impact Magnetron Sputtering), wherein, depending on the desired power introduction or target and layer type, to the corresponding source is advantageously applied a pulse signal within the following parameter range:

| | |
|---|---|
| Pulse width: | 10 μs to 100 μs |
| Pulse voltage: | 100 V to 2 kV |
| Pulse current: | 10 A to 1.5 kA |
| Pulse power: | 5-50 kW |

TABLE 1

| | Example 4 Prior Art | Example 5 | Example 6 | Example 7 | Example 8 |
|---|---|---|---|---|---|
| $C_2H_2$ [sccm] | 220-350 | 0 | 10-25 | 0 | 10-50 |
| Ar [sccm] | 30-50 | 90 | 90 | 115 | 115 |
| $P_{tot}$ [$10^{-3}$ mbar] | 5.0-20 | 3.5 | 2.9-3.0 | 3.2 | 3.2-3.5 |
| $I_{NVB}$ [A] | none | 30 | 30 | 30 | 30 |
| Sputter sources | none | 2 | 2 | 6 | 6 |
| $U_{substrate}$ Pulse [V] | 800-1000 | — | — | — | — |
| $U_{substrate}$ DC [V] | — | 100 | 50/100 | 100 | 50/100/150 |
| $I_{substrate}$ [A] | 0.5-1 A | 0 A | 0.8-1.4 | 0.8 | 0.6-1.0 |
| $r_{deposit}$ [μm/h] | 0.2-0.5 | 0.1 | 0.2-0.6 | 0.8 | 0.6-1.0 |
| $T_{substrate}$ [° C.] | 200-290 | 220 | 200-240 | 270 | 210-270 |
| H [At %][1] | 13-17 | 5 | 12-17 | 5 | 11-15 |
| Layer hardnesses[2] [HIT] | 18.500-31.000 | 4.700 | 13.700-31.000 | 4.500 | 9.500-30.900 |
| Adhesion[3] | a. str. 1-2 | a.str. 1-2 | a.str. 1-2 | a.str. 1-2 | a.str. 1-2 |
| Wear[4] [$m^3 m^{-1} N^{-1} 10^{-15}$] | 0.7-1.0 | >6 | 0.9-5.8 | >6 | 0.4-2.5 |
| Ra/Rz[5] [μm] | | 0.023/0.33 | .015-.033/ .16-.42 | .084/1.48 | .027-.058/ .34-.87 |

[1] Hydrogen content measured by means of SIMS
[2] NIT microlayer hardness according to ISO 14577-1
[3] Adhesion after VDI 3198
[4] Wear test according to standard draft DIN EN 1071-6: 2006-01 for the determination of the abrasion resistance of layers
[5] Roughness Ra, Rz according to DIN EN ISO 4287/88

| List of Reference Numbers | |
|---|---|
| 1 | Vacuum chamber |
| 2 | Workpiece |
| 3 | Workpiece receiver |
| 4 | Double rotation |
| 5 | Triple rotation |
| 6 | Installation axis |
| 7 | Workpiece carrier |
| 8 | Gas feed |
| 9 | Pump stand |
| 10 | NVB Cathode |
| 11 | Arc generator |
| 12 | Switch |
| 13 | NVB Anode |
| 14 | Vaporizer source |
| 15 | Low voltage arc (NVB) |
| 16 | Bias generator |
| 17 | Electromagnetic coil |
| 18 | IF Plasma |
| 19 | Chamber wall |
| 20 | Magnet system |
| 21 | Magnetic near field |
| 22 | Graphite covering |
| 23 | Annular NVB Anode |

The invention claimed is:

1. Vacuum treatment installation for carrying out a plasma method, wherein the treatment installation comprises at least one vacuum chamber in which a device for generating an electric low voltage arc discharge (NVBE) comprised of a cathode and an anode, electrically interconnectable with the cathode via an arc generator, and a workpiece carrier, electrically interconnectable with a bias generator, for receiving and moving workpieces, as well as at least one feed for inert and/or reactive gas are disposed, wherein at least part of the surface of the anode comprises a graphite covering formed as a graphite inlay or graphite overlay.

2. Vacuum treatment installation as claimed in claim 1, wherein the graphite covering is formed as a graphite crucible.

3. Vacuum treatment installation as claimed in claim 1, wherein the graphite covering is disposed on a cooled anode body.

4. Vacuum treatment installation as claimed in claim 1, wherein the anode is not cooled or cooled only indirectly, or in the immediate vicinity of the anode surface no cooling devices, in particular no cooling bores for coolants, are provided.

5. Vacuum treatment installation as claimed in claim 1, wherein at least a portion of the graphite surface of the anode can be heated.

6. Vacuum treatment installation as claimed in claim 1, wherein the anode is disposed on or in a side of the treatment installation, or encompassing the workpiece carrier or preferably in the center of a rotationally symmetric workpiece holder.

7. Vacuum treatment installation as claimed in claim 1, wherein at least two anodes are associated with one cathode.

8. Vacuum treatment installation as claimed in claim 1, wherein at least two cathodes are associated with one anode.

9. Vacuum treatment installation as claimed in claim 1, wherein the bias generator is a DC, an AC current or a unipolar or bipolar pulse generator.

10. Vacuum treatment installation as claimed in claim 1, wherein the arc generator is a DC generator.

11. Vacuum treatment installation as claimed in claim 9, wherein parallel or in series with the DC generator is connected a pulse generator.

12. Vacuum treatment installation as claimed in claim 1, wherein the cathode of the low voltage arc discharge is a hot cathode, an NVB arc cathode or a hollow cathode.

13. Vacuum treatment installation as claimed in claim 12, wherein the hot cathode comprises at least one glow filament, preferably a heating coil, which is disposed in an ionization chamber separated from the vacuum chamber by a shutter.

14. Vacuum treatment installation as claimed in claim 11, wherein the NVB arc cathode comprises at least one cathodically connected target, which is optically separated from the vacuum chamber, in particular from the workpieces, through a covering.

15. Vacuum treatment installation as claimed in claim 1, wherein the device for generating the low voltage arc discharge is disposed axially to one or several electromagnetic coils for generating a Helmholtz field.

16. Vacuum treatment installation as claimed in claim 1, wherein the treatment installation is a vacuum coating installation for carrying out a plasma CVD and/or a PVD method for the deposition of poorly conducting, insulating and/or DLC-like layers.

17. Vacuum coating installation as claimed in claim 16, wherein in the vacuum chamber one or several vaporizer sources are disposed.

18. Vacuum coating installation as claimed in claim 17, wherein the vaporizer source comprises one of the following devices: a sputter source, in an arc source, an electron beam vaporizer, or a graphite crucible.

19. Vacuum coating installation as claimed in claim 17, wherein in the vaporizer source the following material is disposed for vaporization: carbon, a metal or an alloy.

20. Vacuum coating installation as claimed in claim 17, wherein the material for vaporization is provided as the target.

21. Vacuum coating installation as claimed in claim 17, wherein the material for vaporization is a dense, highly pure graphite.

22. Vacuum treatment method for plasma treatment of workpieces, wherein in a vacuum chamber of a treatment installation an electrical low voltage arc discharge (NVBE) is ignited and operated between a cathode and an anode electrically connected with the cathode via an arc generator, while to the workpieces a substrate voltage is applied with a bias generator and process gas from at least one gas source is supplied, wherein a hot anode is utilized at least part of whose surface comprises a graphite covering formed as a graphite inlay or graphite overlay.

23. Vacuum treatment method as claimed in claim 22, wherein the treatment method comprises at least one of the following steps: plasma enhanced heating, etching or coating.

24. Vacuum treatment method as claimed in claim 22, wherein at least a portion of the graphite surface of the anode is so heated that the temperature of the heated graphite surface increases to a temperature which maintains the conductivity of the anode and/or prevents the deposition of insulating coats and/or of insulating layers.

25. Vacuum treatment method as claimed in claim 22, wherein the low voltage arc discharge is guided via a magnetic field.

26. Vacuum treatment method as claimed in claim 22, wherein the treatment method is a vacuum coating method for the coating of workpieces with at least one poorly conducting, insulating and/or DLC-like layer.

27. Vacuum coating method as claimed in claim 26, wherein coating material from at least one gas source and/or at least one vaporizer source is supplied.

28. Vacuum coating method as claimed in claim 27, wherein the coating material supplied from the vaporizer source originates from the discharge of a sputter source, from the discharge of an arc source, from the vapor of an electron beam vaporizer or from the vapor of a material vaporized from a graphite crucible by means of a low voltage arc discharge.

29. Vacuum coating method as claimed in claim 27, wherein the layer is deposited through the operation of a sputter source and/or a cathodic arc source with at least one target of at least one of the materials from the group of metals, metal alloys, metal compounds or of graphite.

30. Vacuum coating method as claimed in claim 27, wherein the layer is deposited through the supply of at least one reactive gas from the group hydrocarbons, silanes, boranes, germanes and/or metallo-organic compounds.

31. Vacuum coating method as claimed in claim 26, wherein the substrate voltage, the low voltage arc and/or the vaporizer source is pulse-operated.

32. Vacuum coating method as claimed in claim 31, wherein a bipolar pulsed substrate voltage with short pulses in comparison to negative pulses, or a unipolar pulsed substrate voltage is applied.

33. Vacuum coating method as claimed in claim 26, wherein by variation of the arc power, the substrate voltage and/or of the magnetic field, layers of different layer stress are produced.

34. Vacuum coating method as claimed in claim 26, wherein a coating comprising at least one layer of one of the following materials is deposited: a carbide, a carbonitride, a nitride, a boride, a boron carbide, a boron nitride, preferably in connection with at least one transition metal from Group IV, V, or VI of the periodic system of elements, aluminum and/or silicon.

35. Vacuum coating method as claimed in claim 26, wherein the coating is deposited as a multilayered coating of different composition.

36. Vacuum coating method as claimed in claim 26, wherein by supplying at least one hydrocarbon via the gas source at least one DLC layer is deposited.

37. Vacuum coating method as claimed in claim 26, wherein by operating a sputter source and/or a cathodic arc source with a graphite target, at least one DLC layer is deposited.

38. Vacuum coating method as claimed in claim 36, wherein the DLC layer is deposited with a metal- or silicon-containing adhesion layer and/or with at least one metal or silicon-containing interlayer as multilayered coating.

39. Vacuum coating method as claimed in claim 36, wherein at least the graphite surface of the anode is heated to a temperature of 200° C., preferably 250° C., in order to prevent the deposition of insulating DLC coats.

40. Vacuum coating method as claimed in claim 36, wherein at least a portion of the DLC coating is deposited as a multilayered coating with layers of different layer stress.

41. Vacuum coating installation as claimed in claim 18, wherein the sputter source is a magnetron, and the arc source is a cathodic arc source.

42. Vacuum coating installation as claimed in claim 20, wherein in an alloy is an alloy of two or several elements of Group IV, V, or VI of the periodic system of elements, as well as aluminum, boron or silicon.

43. Vacuum coating installation as claimed in claim 23, wherein the graphite has an isotropic molecular structure.

44. Vacuum coating installation as claimed in claim 28, further comprising a Helmholtz magnetic field.

45. Vacuum coating installation as claimed in claim 32, wherein the sputter source is a magnetron, and the arc source is a cathodic arc source.

46. Vacuum coating installation as claimed in claim 34, wherein the layer is deposited under the supply of reactive gas.

47. Vacuum coating method as claimed in claim 41, wherein the transitions between the individual layered coatings are implemented such that they are fluid.

48. Vacuum treatment method as claimed in claim 22, wherein the graphite covering is formed as a graphite crucible.

\* \* \* \* \*